United States Patent [19]

Louy et al.

[11] Patent Number: 5,373,280
[45] Date of Patent: Dec. 13, 1994

[54] VEHICLE SIGNAL LIGHT

[75] Inventors: Jean-Francois Louy, Paris; Bernard Mauroy, Roissy En Brie, both of France

[73] Assignee: Valeo Vision, Bobigny Cedex, France

[21] Appl. No.: 936,617

[22] Filed: Aug. 27, 1992

[30] Foreign Application Priority Data

Sep. 2, 1991 [FR] France .................. 91 10839

[51] Int. Cl.$^5$ .................................. B60Q 1/00
[52] U.S. Cl. .................. 340/425.5; 340/468; 340/472; 362/83; 362/238
[58] Field of Search ........... 340/425.5, 469, 468, 340/472, 478, 475, 479; 362/61, 80, 238, 240, 249, 226, 362, 373, 800, 83, 241, 245, 328, 307

[56] References Cited

U.S. PATENT DOCUMENTS

| | | | |
|---|---|---|---|
| 4,935,665 | 6/1990 | Murata | 362/296 |
| 4,953,065 | 8/1990 | Kao. | |
| 4,964,025 | 10/1990 | Smith. | |
| 4,970,812 | 11/1990 | Tanaka et al. | 362/800 |
| 4,990,971 | 2/1991 | Le Creff | 362/800 |
| 5,001,609 | 3/1991 | Gardner et al. | |
| 5,032,960 | 7/1991 | Katoh | 362/800 |
| 5,038,255 | 8/1991 | Nishihashi et al. | |
| 5,099,401 | 3/1992 | Kondo et al. | 362/240 |
| 5,193,895 | 3/1993 | Naruke et al. | 362/800 |

FOREIGN PATENT DOCUMENTS

| | | | |
|---|---|---|---|
| 0362993 | 4/1990 | European Pat. Off. | G02B 5/10 |
| 2481563 | 4/1980 | France | H05B 33/24 |
| 2563929 | 11/1985 | France | G08G 1/095 |
| 2574616 | 6/1986 | France | H05K 7/02 |
| 2601486 | 1/1988 | France | G09F 9/33 |
| 3929125 | 3/1990 | Germany | H01L 23/32 |
| 2139340 | 11/1984 | United Kingdom | B60Q 9/00 |

*Primary Examiner*—John K. Peng
*Assistant Examiner*—Nina Tong
*Attorney, Agent, or Firm*—Morgan & Finnegan

[57] ABSTRACT

A vehicle signal light comprises a support element carrying electroluminescent elements on its front face, together with an optical collimating element. Each electroluminescent element has supply terminals and a semiconductor light source, the electrical supply circuit interconnecting the terminals being arranged on the rear face of the support element, and the latter being non-planar and so shaped to allow mounting of all of the electroluminescent elements in such a way that they are all oriented in the same inclined direction.

17 Claims, 3 Drawing Sheets

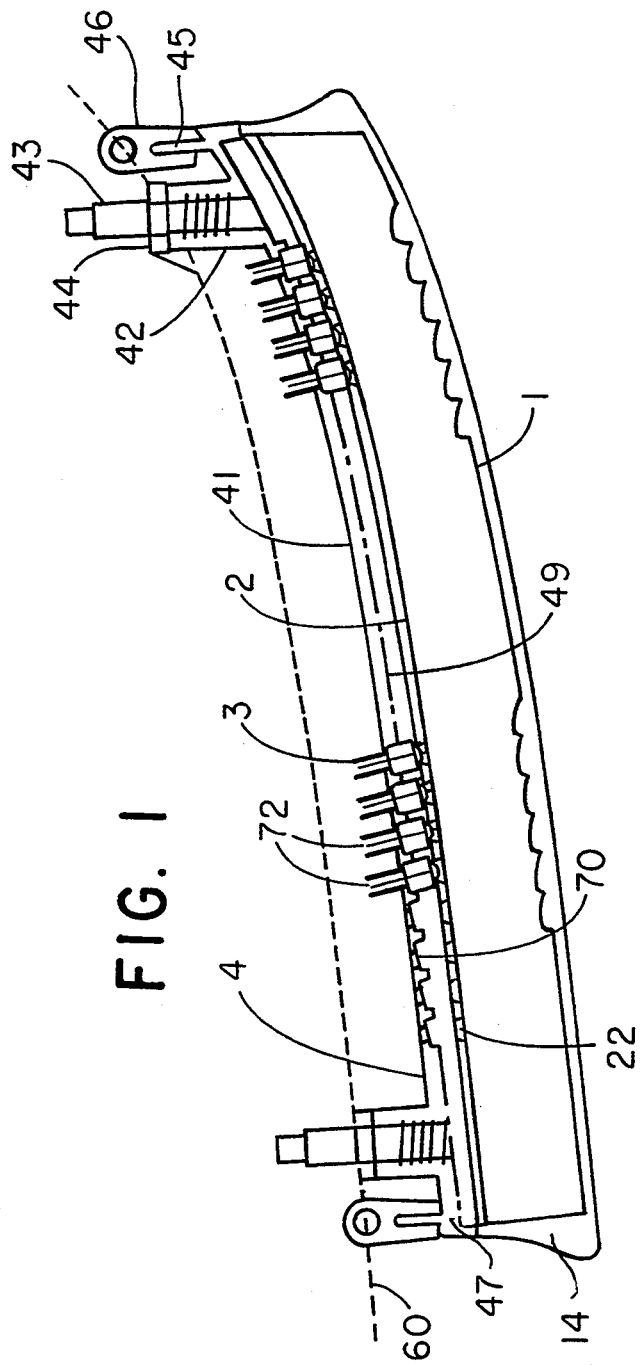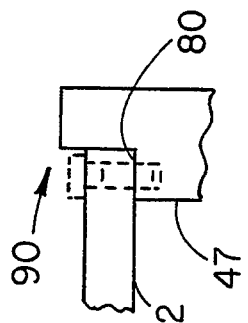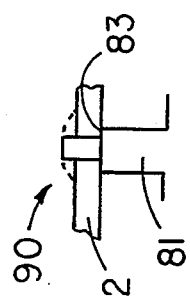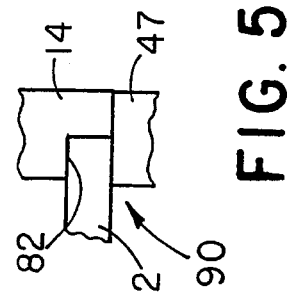

VEHICLE SIGNAL LIGHT

FIELD OF THE INVENTION

The present invention relates in general terms to signal lights of the kind especially applicable to motor vehicles.

BACKGROUND OF THE INVENTION

A vehicle display light of conventional design is in the form of a block or unit which comprises at least one reflector in which an incandescent or fluorescent lamp is mounted, together with a transparent glass or globe which is mounted in front of the reflector. Such a light is relatively thick, and presents problems of adaptation to the support on which it is mounted, this support being typically a corner region of a vehicle, or a wing of the latter.

In general terms, light bulbs are fragile, have a relatively useful life, and are extravagant of energy. For this reason, proposals have been made in the past to provide signal lights in which the light source comprises a group of semiconductor light emitters, such as electroluminescent diodes. Such arrangements offer the possibility of providing, for example, illuminating diodes in two colours (such as the red and orange customary in warning indications given in automotive applications), while being uncoloured when extinguished. This enables a uniform appearance to be obtained when the light is extinguished.

Such a signal light is described and shown for example in the specification of United Kingdom published patent application No. GB 2 139 340A and the corresponding French published patent application No. FR 2 545 195A. In that document, an arrangement is described in which light emitting diodes are mounted by being secured to a support plate which is so shaped as to receive small wafers electroluminescent diodes in cavities, and which is arranged to carry an electrical circuit for providing the connections between these wafers. The latter are covered with a protective layer. A matrix is thus formed, comprising a plurality of diode wafers with common encapsulation and a common diffusing glass.

This arrangement leads to providing, on the support plate that defines a support element, and on the protective layer, a deposited layer of reflective aluminium. This results in a relatively complicated form of construction which necessitates complex manufacturing techniques under clean conditions, which in turn necessitates costly capital investment. For these reasons, such an arrangement is not open to adoption by a manufacturer of motor vehicle signal lights.

In order to simplify the support element (the plate), an approach may be considered, as disclosed in the specifications of French published patent applications FR 2 481 563A, FR 2 601 486A and FR 2 574 616A and in those of the European published application EP 0 253 244A corresponding to the second of the above mentioned French applications, and U.S. Pat. No. 4,742,432 corresponding to the third of these French applications, in which discrete electroluminescent elements are used. These elements include a support member which carries supply terminals and which has a semiconductor light source or emitter.

In such an arrangement the support element no longer needs to be formed with reflective cavities. It does however pose a new assembly problem. This is that, if an optical collimating element is associated with the support element, in the manner disclosed in the above mentioned United States patent, the optical collimating element has to be finally fitted on to the support element which carries the electroluminescent elements, the latter having previously been fixed on to the support element so as to facilitate fitting of the electroluminescent elements. The optical collimating element is mounted on the electroluminescent elements with a clearance, and is formed with parabolic cavities, with insulating apertures engaging conductive rings of the electroluminescent elements with a small clearance. In some case therefore, the electroluminescent elements cannot be arranged on the optical axis of the parabola, and this is detrimental to performance of the signal light.

In addition, when the light has an irregular or complex shape, for example when it is of bulged or convex form, fitting can become very difficult.

Again, it is generally undesirable to lose the electroluminescent elements, yet the latter are difficult to manipulate and transport with the support element before the electroluminescent elements have been assembled to their electrical circuit, without serious risk of their becoming separated and lost.

DISCUSSION OF THE INVENTION

An object of the present invention is to overcome these drawbacks, by providing a novel signal light with a simplified support element, while continuing to benefit from an inexpensive and easy technique for assembling the electroluminescent elements with their associated electrical supply circuit, and at the same time providing good optical performance regardless of the particular shape of the signal light.

According to the invention, a signal light, in particular for a motor vehicle, of the kind comprising: an optical collimating element; electroluminescent elements each of which includes supply terminals and a semiconductor type light emitting element; and a support element for supporting the electroluminescent elements, the said support element firstly having a front face for engagement of the electroluminescent elements thereon, and a rear face, and secondly carrying an electrical supply circuit for supplying and interconnecting the said supply terminals, is characterised in that, in combination, the support element has a non-planar shape, and in that the support element is so shaped as to define mounting means extending in a common given inclined direction, for mounting the electroluminescent elements.

With this arrangement it is possible to assemble the electroluminescent elements on their support element, automatically with the aid of a simplified robot and at increased speed, since all of the electroluminescent elements are oriented in the same direction. This arrangement enables careful manual fitting to be avoided, while simplified and less expensive automatic equipment, operating in a single direction, can be employed.

According to a preferred feature of the invention, the said electroluminescent elements are sandwiched between the support element and the optical collimating element, the latter being connected to the said support element by fastening means.

In a signal light according to the invention it is possible to mount the electroluminescent elements on their support element, with a clearance but without securing them, and then to assemble the optical collimating element to the support element in such a way as to create a sub-assembly consisting of the optical collimating element, the electroluminescent elements and the support element. This sub-assembly is readily able to be manipulated, transported and stored as a unit.

It will be appreciated firstly that the optical collimating element protects the electroluminescent elements, the latter being in the form of inexpensively mass-produced electronic components; and secondly, that it enables these elements to be properly positioned on the optical axes before they are secured to the support element, and regardless of the shape of the signal light.

It is thus possible to make the sub-assembly in one location, and then to move it away without any danger of the electroluminescent elements being lost, to another location for assembly of the electrical terminals of the electroluminescent elements with their associated electrical circuit, and yet at the same time to produce a signal light of very high optical performance.

It will be appreciated that this operation is made easy because the electroluminescent elements are trapped in position. It is even possible to turn the signal light and/or the terminals of the diodes over in order to fit in position further optical or electronic components on the rear face of the support element. All in all, manufacture of the signal light is thus both inexpensive and simple.

The axial compactness of the said sub-assembly will also be appreciated, as will its ability to be shaped so as to conform readily to the support on which it is to be mounted, for example a corner region of the vehicle or a wing of the vehicle.

In arrangements according to the invention, the support element may readily be provided with fastening means for securing the signal light to the above mentioned support. The support element of the signal light itself may also carry a seal defined by a flange, and is preferably also covered with a transparent element. The seal thus sealingly protects the terminals and the electrical circuit between the rear face of the support element or carrier and the bodywork of the vehicle. The flange of the support element may be so shaped as to mate with the shape of the bodywork of the vehicle, thus providing sealing by mating cooperation.

The arrangement according to the invention facilitates automatic fitting of the electroluminescent elements, and also enables fitting times to be reduced.

One of the effects of the invention is that the optical collimating element locates the electroluminescent elements and positions them precisely in such a way that the latter do not have to be offered up very accurately. For example, the electroluminescent elements may have terminals in the form of fingers extending with a clearance through passages formed in the carrier, such a clearance being favourable to automatic assembly. The electroluminescent element may thus have a large number of shapes without detriment to automatic assembly.

The optical collimating element is preferably formed as a light guide, with appropriately shaped holes corresponding with the light sources of the electroluminescent elements. The optical collimating element can thus be given a simple shape such that it can easily be made by moulding, and the same remarks are true for the support element.

Where, as in preferred arrangements, a transparent element overlies or overhangs the optical collimating element, the transparent element may be of uniform colour (for example smoked), or it may be made in a plurality of colours as required. The transparent element may or may not have an optical function.

Thus, according to another feature, the transparent element is so shaped that it can redirect or align the inclined beams generated by the electroluminescent elements in cooperation with the optical collimating element, into a mean direction corresponding to the direction of travel of the vehicle, and can diffuse the emitted light about this mean direction in such a way as to satisfy the photometric aspects of the appropriate regulations.

Further features, objects and advantages of the invention will appear more clearly from a reading of the description of preferred embodiments of the invention which follows, and which is given by way of example only and with reference to the accompanying drawings.

BRIEF DESCRIPTION OF THE DRAWINGS

FIG. 1 is a view in horizontal cross section of the signal light in accordance with the invention.

FIG. 3 is a partial view showing the assembly of an optical collimating element with the support element of the signal light.

FIGS. 4 and 5 are views similar to FIG. 3, but showing respectively a second and a third mode of assembly of the optical collimating element with its support element.

Figure 2:
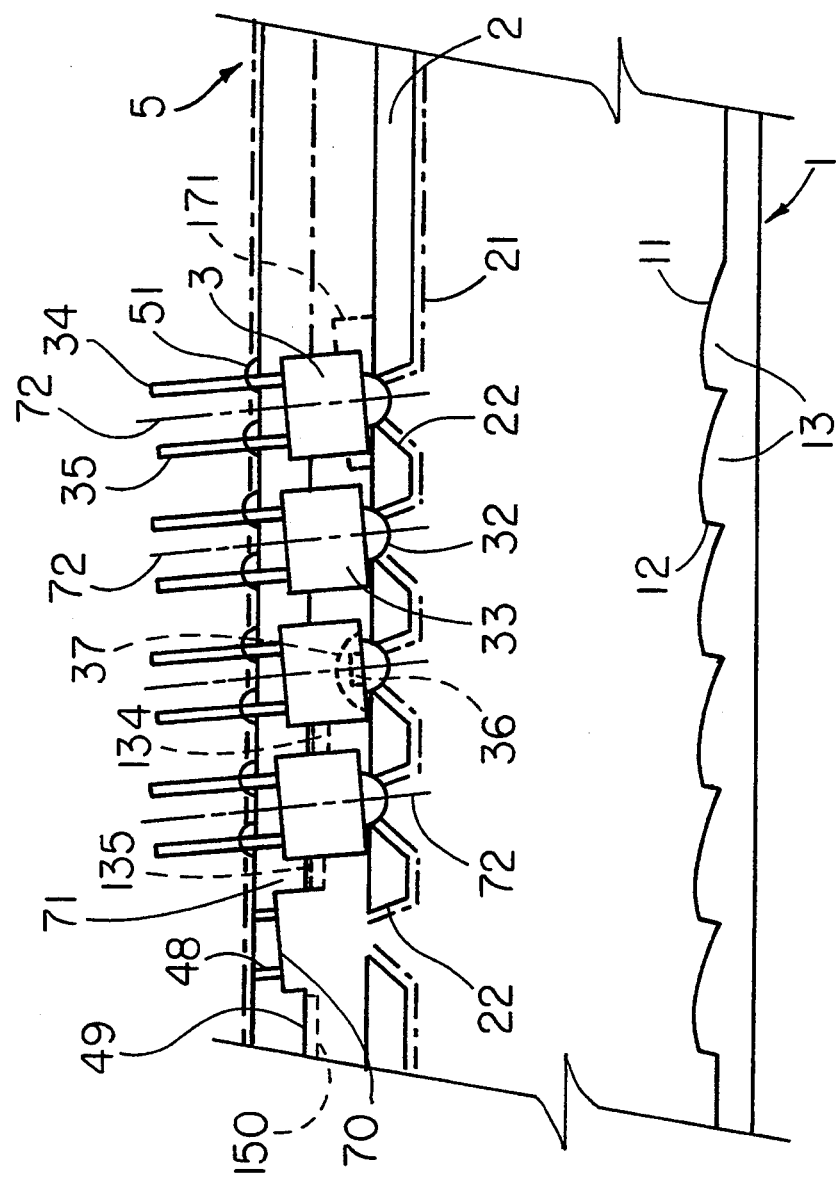
FIG. 2 is a view on a larger scale showing part of FIG. 1.

DESCRIPTION OF PREFERRED
EMBODIMENTS OF THE INVENTION

In this description, the term "insulating element" is to be taken to mean an element, component, or part of a component, which is electrically insulating, such as for example the elements 33, 2 and 4 to be described subsequently herein.

Referring first to FIG. 1, an signal light includes a transparent element 1, an optical collimating element 2, electroluminescent elements 3, and a support element 4 for supporting the electroluminescent elements 3. As shown, the signal light has a complex shape, and the support element 4 is not flat.

In this example, and with reference in particular to FIG. 2, each electroluminescent element 3 includes a support 33. Projecting from one of the faces of the support 33 are supply terminals 34 and 35 (comprising an anode and a cathode respectively), while an encapsulating element 32, referred to in the rest of this description as a capsule, projects from the other face of the support. In this example the capsule 32 has a penetrating or male shape. It surrounds a semiconductor type light-emitting element 36, for example a crystal, which is carried by the support 33. The terminals 34 and 35 may or may not be surrounded by the support 33, the latter being generally of insulating material.

The support element 4 is formed with passages 48 for accommodating the terminals 34 and 35. The latter extend through the passages 48 and the support element 4, in this example with a clearance. Accordingly, the same number of passages 48 as the number of terminals 34 and 35 appropriate to each element 3 is provided for each of the latter.

The support element 4 is of insulating material and of irregular shape, and in this example it is also opaque. On the rear face 41 of the support element 4, i.e. the face directed towards the bodywork 60 of the vehicle, there is carried an electrical supply circuit 5 for supplying the supply terminals 34 and 35. This circuit 5 connects the supply terminals for the purpose of energising the electroluminescent elements 3.

It will be noted that the complex form of the support element requires the provision of a three-dimensional network of discrete electroluminescent elements 3. In a known manner, the circuit 5 is connected to the electrical wiring bundle of the vehicle through a suitable supply connector, not shown.

The electroluminescent elements 3 are sandwiched between the support element 4 and the optical collimating element 2, which is connected to the support element by fastening means 90. More precisely, the electroluminescent elements 3 consists, in this example, of the devices which are mass-produced by the Hewlett-Packard company under the name "Brewsters", which will where convenient be referred to as such in this description, without prejudice to the fact that the name "Brewster" may be a trade mark. The brewsters 3 include an insulating support 33 which is in this example wider than the capsule 32, which may be said to constitute the eye of the electroluminescent element 3. The brewsters form a three-dimensional network, in the form of a matrix with lines and columns of brewsters. In FIG. 1, one line of brewsters is shown, while in FIG. 7, to which reference is invited, the axes of the network are shown with some apertures 22 of the element to be described below. In this example the terminals 34 and 35 are in the form of conductive tongues.

It is of course possible to use electroluminescent diodes in the manner described for example in the specifications of U.S. Pat. Nos. 4,964,025 and 5,001,609 and the corresponding European published patent application No. EP 0 362 993A; French published patent application No. FR 2 481 563A; or the French published patent application No. FR 2 601 486A and the corresponding European publication EP 0 253 244A.

The support 33 is carried by the front face 49 of the support element 4, which is directed outwardly in the opposite direction from its rear face 41 and away from the bodywork 60. The rear face 41 of the support element 4 is overlaid by the electrical circuit 5. In this example, the latter is preferably applied by silk screen printing, though in a modification it may be applied by electrochemical or electrolytic deposition. It is also possible to apply the electrical circuit in the form of a flexible film, which is applied adhesively on to the rear face 41 of the support element 4 by means of an adhesive layer, which may itself be in the form of a film. The flexible film carries a coppered and tinned coating. Thus, in this embodiment, the front face 49 of the support element 4 carries the electroluminescent elements 3 while itself having no electrical circuit.

From place to place on the rear face 41 of the element 4, the latter carries fastening means for securing the signal light to the appropriate support member on which it is to be mounted. In this embodiment, these fastening means comprise dowels 43 which are fitted in hollow spigots 42 fixed with respect to the support element 4. A nut 44 cooperates with the dowels 43 and the spigots 42 for mounting the signal light on the bodywork 60 of the vehicle. In a modification, fastening lugs may be provided, being formed with holes for the passage of fastening elements (for example screws). Alternatively, the fastening means may comprise hook-shaped resilient lugs for clip-type mounting of the signal light in the corresponding holes formed in the bodywork. The rear face 41 of the element 4 also has a peripheral rib 45 for mounting a seal 46 between the signal light and the bodywork 60 of the vehicle.

The support element 4 is hollow, and has a peripheral wall or flange 47 which delimits the contour of the element 4, and which projects outwardly, i.e. away from the rib 45, from the base of the element 4 which is the portion of the latter that actually carries the elements 3, this base being formed with the passages 48.

In this example, the support element or carrier 4 is preferably made of an electrically insulating material which in practice is a plastics material, and has a non-planar, generally bulged or convex form which is adapted to fit and match the shape of the adjacent part of the bodywork 60. The carrier 4 is made in a simple way by moulding, as is the element 2 to be described below, with the spigots 42, the rib 45 and the flange 47 being integral with the remainder of the carrier 4. It will be appreciated that the rib 45 is made of such a depth that, as is best seen in FIG. 1, it provides protection for the terminals 34 and 35, and also for any other electronic components which may be provided, before the seal 46 is fitted. Thus the support element or carrier 4 has an additional function, i.e. of acting as a protective member due to its rib or peripheral wall 45 being deeper than the terminals 34 and 35.

Once the assembly has been fitted on to the vehicle, the seal 46 cooperates with the rib 45 and the adjacent portion of the bodywork 60 to ensure protective sealing for the electrical circuit 5 and the terminals 34 and 35, thus leading to a long useful life and reliability for the signal light as a whole.

It will be realised that the rib 45 can of course be so profiled as to be fitted in an appropriate reinforcing element of the bodywork 60, so that it then provides by itself, by mating cooperation, the sealing for the terminals 34 and 35 and for the electrical circuit 5.

The opaque support element 4 is so shaped as to define mounting means 70, 71 for the electroluminescent elements 3, these mounting means being oriented in a given inclined direction. The mounting means therefore define means for orientation in a given direction, and comprise engagement surfaces 70 together with locating ribs 71 which project from the surfaces 70. The surfaces 70 and the ribs 71 are formed on the front face 49 of the support element 4, as is best seen in FIG. 2.

The through passages 48 each terminate in an open end in a respective one of the surfaces 70, and in this example the passages 48 are symmetrical with respect to an axis indicated at 72 in FIG. 2. The same is true for the longitudinal walls of the ribs 71, which extend at right angles to the surfaces 70. The axes 72 are thus inclined with respect to the axial direction of travel A of the vehicle (see FIG. 1), and constitute axes of symmetry for the surfaces 70 and the supports 33 of the elements 3. It will be appreciated that the surfaces 70, together with the ribs 71, define a rectangular grid and delimit the front face 49 of the support element 4.

The ribs 71 are adapted to fit the shape of the supports 33 for cooperation with the latter, in this example with a characteristic clearance. The supports 33 may be cylindrical in shape or in the form of a parallelepipeds.

All of the surfaces 70 are parallel with each other. As between one surface 70 and another, it is only the thickness of the carrying element 4 that varies as a function of the shape of the signal light. As shown, this shape is of course curved.

Each electroluminescent element may be fitted automatically on the corresponding engagement surface 70 with the aid of a simple robot, with all these elements being fitted in a common inclined direction and being pre-positioned by the corresponding ribs 71. The inner edges of the latter are preferably chamfered, and the base of the support 33 of each element 3 is in contact with the engagement surface 70, while the side walls of the support 33 are partly surrounded by the ribs 71, the contour of which is adapted to that of the support 33.

The ribs 71 thus provide initial location for the supports 33, and prevent the electroluminescent elements from falling away by simple gravity. They retain the elements 3 in position and also prevent the latter from being embedded in such a way that they could act by themselves as structural spacing means between the elements 2 and 4, such that the signal light might become distorted. Fitting times are very short with this procedure, and the robot is idle for only very short periods. In addition, this fitting method is easy because the terminals 34 and 35 pass with a clearance through the passages 48, and because there is a clearance between the ribs and the support 33.

In this example, the optical collimating element 2 comprises a reflector which is configured as a light guide. More precisely, this optical collimating element has a flared hole 22 formed in line with each capsule 32, the function of the holes 22 being to diffuse the light. The light emitting capsule 32 is placed approximately at the focus of the corresponding hole 22, which is wider at the level of the front face, facing towards the transparent element 1, of the collimating element 2. At the level of the rear face of the element 2, the size of the holes 22 is adapted to fit that of the capsules 32.

The optical collimating element 2 comprises a convex plate of insulating material. Both the front face of the element 2, and the internal surfaces of its through holes 22, are coated with a reflective layer 21. The holes 22 define a three-dimensional network of holes 22 which is an image of the network of electroluminescent elements 3. In this example, the optical element 2 has a complex or irregular shape which is the image of that of the support element 4, and is of an opaque plastics material, the reflective coating 21 being of aluminium. The optical element 2 overhangs the engagement surfaces 70 and the locating ribs 71, in such a way that it serves generally as a cover for the support element 4.

It will be appreciated that, as with the support element 4, manufacture of the optical collimating element 2 is easy, and that stripping of the holes 22 from the mould poses no problems. These holes 22 may in fact have any desired shape whatever, depending on the application and on the position of the hole concerned in the signal light. Their shape can be calculated by means of a computer, with the angle of aperture of each hole, and the inclination of its axis, varying according to its position in the signal light.

Having regard to the inclination of the axes 72 with respect to the direction of travel A, the transparent element 1, which in this example is of a suitable plastics material, is so made as to ensure, in as simple and cost-effective way as possible, both the alignment of the inclined light beams produced by the electroluminescent elements 3 and the optical collimating element 2 (in a mean direction which is essentially parallel to the axial direction A of travel of the vehicle), and the diffusion of these light beams around the mean direction in order to satisfy any regulations relating to photometric requirements for road vehicles.

To this end, the internal surface of the transparent element 1 is formed with a succession of prismatic elements 13, which have inclined surfaces 11 separated by return faces 12. The inclined surfaces 11 are input surfaces for the incident light, and are divided into individual, convex, surface facets. The input surface inclination defined by these facets ensures, in this case by refraction, the alignment of the light beams or radiation so as to direct the said radiation in a mean direction which is parallel to the direction A, while the convex shape of the elemental facets at the same time provides controlled diffusion of the radiation.

In modifications, it is possible to use individual facets having concave surfaces or, alternatively, prismatic elements. The alignment of the radiation can of course be obtained by the use of two layers of transparent or translucent materials having different refractive indices, diffusion particles or the like being provided in one of these layers.

The transparent element 1 is of complex, curved and hollow shape in the image of the elements 2 and 4, and again has a peripheral flange, 14, which is adapted to cooperate with the flange 47 of the support element 4. The element 1 thus overhangs the element 4 and the element 2, while in this example its flange 14 is sealingly fixed to the flange 47, with the flanges 14 and 47 defining a gap between the transparent element 1 and the optical collimating element 2. This arrangement enables the heat produced by the elements 3 to be satisfactorily removed.

The fastening means 90 (see FIG. 3) include a rebate 80 formed at the outer periphery of the flange 47. The element 2 is adapted to bear through its rear face against the horizontal portion of the rebate 80, and to make contact through its side face with the vertical portion of the rebate 80, so as to enable the element 2 to be located initially, with a clearance, in the support element 4. The rebate 80 thus constitutes a shoulder for the collimating element 2.

Accordingly, starting with a support element 4 already carrying its electrical circuit 5, assembly is carried out in the following way.

1. The electroluminescent elements 3 are inserted with a clearance into the passages 20 with the aid of a robot, in the direction defined by the parallel axes 22, insertion being made through the front face 49 of the support element 4. The robot is such as to enable the terminals 34 and 35 to be inserted automatically into the through passages 48, until the rear faces of the supports 33 of the elements 3 come into contact with the engagement surfaces 70, the supports 33 first encountering the locating ribs 71 and being guided by the latter.
2. The optical collimating element 2 is then fitted by fitting the holes 22 over the capsules 32 of the elements 3, after which the collimating element 2 is secured to the carrying element 4.
3. Subsequently, the terminals 34 and 35 are connected to their electrical circuit 5.

It will be appreciated that the collimating element 2 ensures centring of the brewsters 3 before it is secured to the support element 4.

It will be evident from the foregoing description that during the above mentioned insertion, the holes 22 cooperate with the male capsule 32, which in this example are in ogee form or in the form of a half olive, in such a way that the supports 33, located with a clearance by the ribs 71 and the passages 48, automatically take up their correct position. They thus assume the ideal position for defining the focus of the optical centre of the optical system. Optical performance of the signal light is thus excellent, even if the latter is of complex shape as in the present example. Due to the male or penetrating form of the capsules 32, there may be no clearance between the rear end of each hole 22, which is adapted to fit to the dimensions of the corresponding capsule 32, and the latter. This contributes to good light emission.

As can be seen in FIG. 3, fastening of the collimating element 2 can be carried out by the aid of screws which are screwed into the flange 47 through the horizontal portion of the rebate 80, with the element 2 being mounted in the latter with a clearance. This arrangement enables the element 2 to be subsequently removed where necessary. In a modification, in place of screw fastening, fastening may be obtained adhesively, using adhesive spots.

Referring now to FIG. 4 which shows a modification, the fastening means 90 in this example include stepped dowels 81 which project from the support element 4 and which define a radial shoulder 83, with the free end of each dowel 81 projecting beyond the collimating element 2 so that it can be upset over the latter by heating. The collimating element 2 is then engaged on the free ends of the dowels 81 and in contact with their shoulders 83. The heating and upsetting of the projecting head of each dowel 81 is then carried out so as to secure the collimating element 2 by causing it to be gripped between the shoulders 83 and the heads so formed. In a modification, not shown, this assembly may be carried out by clipping, to which end the support element 4 has resilient lugs with hook-shaped ends which are adapted to snap-fit into corresponding apertures formed in the collimating element 2.

An assembly is thus formed which is readily handled and transported, and which comprises the various elements 2, 3 and 4, the elements 3 being retained by the supports 33 between the elements 2 and 4.

Referring once again to FIG. 2, it can be seen that the electroluminescent elements 3 act as spacers (by virtue of their supports 33) between the support element 4 and the collimating element 2. A slight clearance is preferably arranged between the collimating element 2 and the horizontal portion of the rebate 80 seen in FIG. 3, or else between the collimating element 2 and the shoulder 83 seen in FIG. 4. The electroluminescent elements 3 may of course be trapped with a slight clearance between the support 4 and the collimating element 2, by virtue of their supports 33. In every case, however, the light producing elements 3, being sandwiched, cannot escape.

Thus the assembly of the components 1, 2 and 3 can be easily manipulated in such a way that access can be had to the rear face 41, for example by turning the support element 4 back, in order to carry out soldering (as can be seen in FIG. 2 at 51) of the terminals 34 and 35 to the associated electrical circuit 5, the latter being tinned for this purpose. This soldering operation may be carried out in a vacuum, for example using a moving tin bath, or in an autoclave or oven for melting flux, with tin being previously put on to the terminals 34 and 35.

In a modification, a polymerisable conductive adhesive, or connection by means of induction or microwave heating, may be used. In every case, whether or not the support element 4 is turned back, a satisfactory soldering operation is ensured by the placing of the elements 3 between the collimating element 2 and the support element 4.

It will be appreciated that the formation of the electrical circuit 5 by silk screen printing, in which a conductive ink is deposited on the support element 4, enables the terminals 34 and 35 to be easily fitted, with the circuit 5 running no danger of lifting off during insertion of the terminals with a clearance in the passages 48. The same is true when the electrical circuit is in the form of a flexible film secured adhesively on the rear face 41 of the support element 4 and drawn into alignment with the passages 48, or when it is made by electrolytic or electrochemical deposition as mentioned above. The holes in the electrical circuit, for passage of the terminals 34 and 35 through them, are preferably larger than the passages 48.

Once the elements 3 have been secured, the transparent element 1 is sealing secured, through its flange 14, on to the flange 47 of the support element 4. This sealing fastening may be carried out either adhesively, or by hot welding or ultrasonic welding, so that perfect sealing is obtained between the support element 4 and the transparent element 1.

The present invention is of course not limited to the embodiments described above. In particular, and referring to FIG. 5, the optical collimating element 2 may be fastened by sandwiching its edge between the flanges 14 and 47 of the transparent element 1 and the support element 4 respectively. In another modification, this fastening may be obtained by clipping action, with the flange 14 then having resilient hooked lugs which pass through apertures in the support element 4 so as to hook into the latter.

The flange 14 may be of profiled configuration and may cooperate with a reinforcing element of the bodywork 60 of the vehicle, so as to ensure sealing of the signal light by mating cooperation with such reinforcing element. In that case, the flange 14 envelops the support element 4.

It will be appreciated that in every case the capsules of the electroluminescent elements 3 are protected either by the collimating element 2, or else by the transparent element 1, before the terminals 34 and 35 are secured to the electrical circuit 5.

Figure 6:
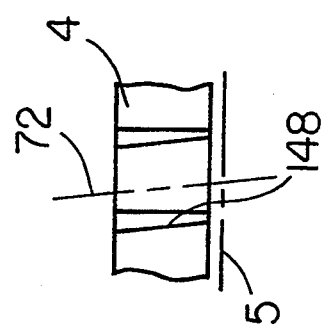
FIG. 6 is a partial view showing a second variant of the orienting means for mounting the electroluminescent elements.

In another modification, the engagement surfaces 70 may be replaced by flared passages 148, which are shown in FIG. 6. These passages 148 are partly parallel to the axes 72, so that the terminals 34 and 35 find their place naturally along that portion of the corresponding passages 148 that is parallel to the axes 72.

The signal light in its various embodiments as described above is a rear display of the vehicle and the electroluminescent elements 3 are here of two different colours when illuminated, in order to provide the brake light and direction signalling functions in particular.

Figure 8:
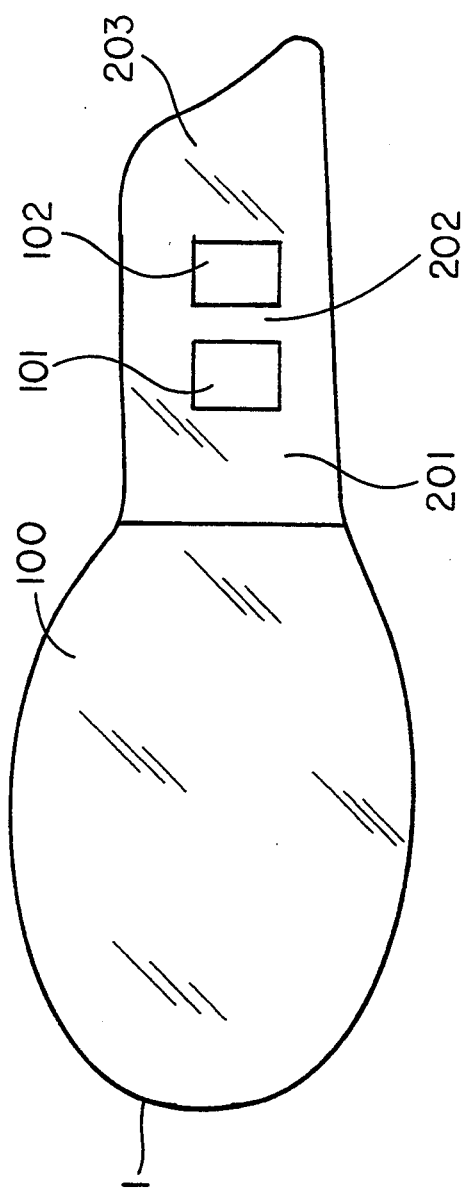

In general terms, however, the transparent element may or may not have a specific optical function. Depending on applications, it may modify the beam emitted by the assembly 2, 3, 4 in order to spread it, align it, or concentrate it, as required. The transparent element may be of a neutral, or a smoked, colour. In the present example it is amber and red. In the form shown in FIG. 8, it accordingly has three zones 100, 101 and 102, all coloured amber, together with three further portions 201, 202 and 203 all of which are red.

The portions 101 and 102 are arranged within the portions 201, 202 and 203 for the purpose of providing the intermittent direction indications. The functions of the zones 201, 202 and 203 are respectively those of brake light, rear light and rear fog light. The three zones 100, 101 and 102 may be illuminated all at the same time, or differentially as desired.

Similarly, it is possible to illuminate one or a plurality of groups of light emitting diodes, for example as a function of the intensity of braking. Similarly, it is possible to signal actual messages. It will be appreciated that all of this is made possible to achieve with high optical performance by virtue of the present invention.

Figure 7:
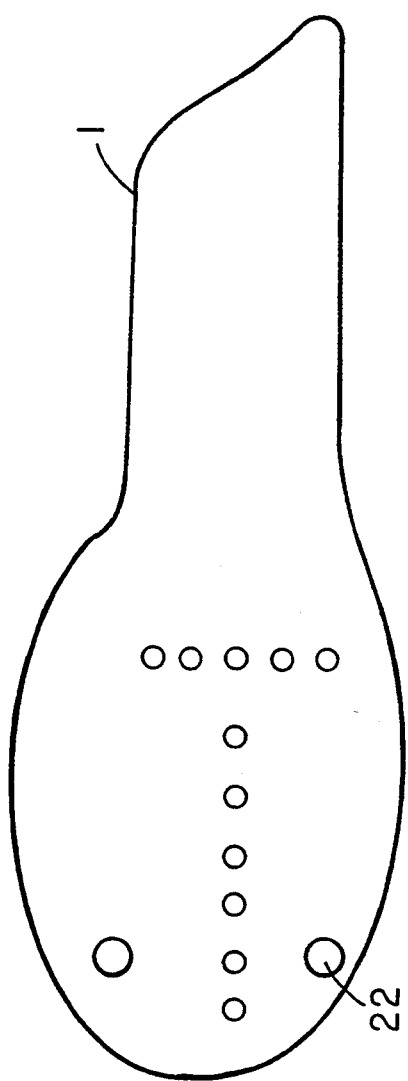
FIGS. 7 and 8 are simplified front views showing, respectively, the optical collimating element and the transparent element.

Due to the simple configuration of the collimating element 2 it is possible to make the holes 22 of different sizes, as is illustrated for example in FIG. 7. It is also possible to vary the shape of the divergence of these holes as between one hole and another, so as to give the best possible lighting effect having regard to the irregular or complex shape of the signal light. As shown, these holes define conic sections of revolution, a conic section being a surface corresponding to the geometrical locus of points such that the ratio of the distance of each such point from a fixed point, referred to as the focus, and from a straight line known as the directrix, has a given value.

The arrangements described in United Kingdom published patent specification GB 2 139 340A and the corresponding French published patent application FR 2 545 195A, in which the elements have three supply terminals, may be used. In that case, three passages 48 are associated with each element 3. A component of the kind described in French published patent application No. FR 2 601 486A and the corresponding European published patent specification EP 0 253 244A may be fitted. In that case, the front face 49 of the support element 4 carries an electrical circuit 150, indicated in FIG. 2 in broken lines, the support 33 of each element 3 having the corresponding terminals 134 and 135 projecting laterally from it. The terminals then do not pass through the element 4, but instead only the connecting portions pass through the latter, as is described in the above mentioned patent specifications. The circuit 150 is, in that case, mounted on the ribs 71. It is then preferably the support 33 of each element 3 that cooperates with the collimating element 2 and support element 4.

The structures may be inverted; for example the collimating element 2 may carry the ribs, especially when discrete components are employed in the manner disclosed in the above mentioned European specification EP 0 253 244A. This arrangement is also indicated in FIG. 2 in broken lines, with ribs 171 then locating the electroluminescent diodes 3.

It is of course possible easily to include further electronic components, as required, at the level of the accessible rear face of the support element. Examples of such additional components are microprocessor power components, and infra-red emitting and receiving components.

What is claimed is

1. A signal light for a motor vehicle having an axial direction of travel comprising: a support element having a front face and a rear face; a plurality of electroluminescent elements carried on said front face of the support element, each of said electroluminescent elements including supply terminals and a semiconductor type light source; an optical collimating element associated with the support element and said electroluminescent elements for collimating light emitted by said light sources; and an electrical circuit carried by said support element for supplying and interconnecting said terminals, wherein the support element is non-planar and includes a plurality of mounting means for receiving the electroluminescent elements and directing the collimated light emitted by said light sources along parallel paths, said plurality of mounting means oriented in a common inclined direction and carrying the electroluminescent elements, said common inclined direction being inclined with respect to said axial direction of travel.

2. The signal light according to claim 1, wherein said of said mounting means includes an engagement surface formed on the front face of the support element and perpendicular to a respective parallel path.

3. The signal light according to claim 2, wherein each of said engagement surfaces are parallel to each other.

4. The signal light according to claim 3, wherein the support element defines a thickness that varies as between one of said engagement surface and another according to the shape of the signal light.

5. The signal light according to claim 2, wherein said mounting further include a plurality of locating ribs projecting from said engagement surfaces.

6. The signal light according to claim 5, further including fastening means securing the optical collimating element to the support element, with the electroluminescent elements being sandwiched between the support element and the collimating element.

7. The signal light according to claim 6, wherein the support element further includes a peripheral rib carried by said rear face, the peripheral rib being deeper than said terminals whereby to protect said terminals and the electrical circuit.

8. The signal light according to claim 7, wherein the fastening means include a plurality of stepped dowels projecting from the support element, each said dowel extending through the optical collimating element and having a free end projecting beyond the optical collimating element.

9. The signal light according to claim 7, wherein the support element is hollow and further includes a peripheral flange defining the contour of the support element, the flange being formed with a rebate, with said fastening means being formed in said rebate.

10. The signal light according to claim 9, wherein the rebate has a horizontal portion and the fastening means further include screws screwed into the flange through said horizontal portion of the rebate.

11. The signal light according to claim 6, wherein the support element further defines passages for mounting the supply terminals therein, said passages being parallel to said paths and being open at the engagement surfaces.

12. The signal light according to claim 6, wherein said electrical circuit is formed by silk screen printing on the rear face of the suppport element.

13. The signal light according to claim 6, further including a flexible film and an adhesive layer securing the flexible film on the rear face of the support element, said electrical circuit being formed on the flexible film.

14. The signal light according to claim 6, further including a transparent element coupled to the optical collimating element in said parallel paths.

15. The signal light according to claim 14, wherein the support element is hollow and has a first peripheral flange projecting outwardly from said suppport element, the transparent element also being hollow and having a second peripheral flange cooperating with the first peripheral flange.

16. The signal light according to claim 15, wherein said second flange is sealingly joined to said first flange.

17. The signal light according to claim 16, further including securing means carried by the rear face of the support element for securing the signal light to the bodywork of the vehicle.

* * * * *

UNITED STATES PATENT AND TRADEMARK OFFICE
CERTIFICATE OF CORRECTION

PATENT NO.    : 5,373,280
DATED         : December 13, 1994
INVENTOR(S)   : Jean Francois Louy et al.

It is certified that error appears in the above-identified patent and that said Letters Patent is hereby corrected as shown below:

In claim 2, column 12, line 15, delete the word "said" and insesrt therefor -- each --.

In claim 5, column 12, line 26, after the word "mounting", insert -- means --.

Signed and Sealed this

Eleventh Day of April, 1995

Attest:

BRUCE LEHMAN

*Attesting Officer*            *Commissioner of Patents and Trademarks*